(12) United States Patent
Arbogast et al.

(10) Patent No.: US 6,888,291 B2
(45) Date of Patent: May 3, 2005

(54) ELECTRICAL SYSTEM FOR ELECTROSTRICTIVE BIMORPH ACTUATOR

(75) Inventors: Darin J. Arbogast, Maple Valley, WA (US); Frederick T. Calkins, Seattle, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 10/286,097

(22) Filed: Oct. 31, 2002

(65) Prior Publication Data

US 2004/0084997 A1 May 6, 2004

(51) Int. Cl.⁷ .............................................. H01L 41/047
(52) U.S. Cl. ...................................... 310/331; 310/366
(58) Field of Search ................................ 310/330–332, 310/365, 366

(56) References Cited

U.S. PATENT DOCUMENTS

| | | | | |
|---|---|---|---|---|
| 2,472,179 A | * | 6/1949 | Tibhetts ........................ 310/363 |
| 3,365,592 A | * | 1/1968 | Krautwald et al. .......... 310/331 |
| 3,378,704 A | * | 4/1968 | Smith et al. .................. 310/366 |
| 3,442,570 A | * | 5/1969 | Picker .......................... 359/291 |
| 4,342,936 A | * | 8/1982 | Marcus et al. ............... 310/330 |
| 4,349,762 A | * | 9/1982 | Kitamura et al. ............ 310/332 |
| 4,403,166 A | * | 9/1983 | Tanaka et al. ............... 310/332 |
| 4,530,138 A | * | 7/1985 | Ritter .......................... 29/25.35 |
| 4,533,849 A | * | 8/1985 | Schnell ........................ 310/330 |
| 5,068,567 A | * | 11/1991 | Jones .......................... 310/332 |
| 5,076,314 A | * | 12/1991 | Ikehata et al. ............... 137/82 |
| 5,083,056 A | * | 1/1992 | Kondou et al. .............. 310/332 |
| 5,461,274 A | * | 10/1995 | Yuji et al. .................... 310/330 |
| 5,500,777 A | * | 3/1996 | Hasegawa et al. ........ 360/77.16 |
| 5,552,658 A | * | 9/1996 | Dibbern et al. ............. 310/366 |
| 6,297,579 B1 | * | 10/2001 | Martin et al. ............... 310/330 |
| 6,307,302 B1 | * | 10/2001 | Toda ............................ 310/334 |
| 6,329,741 B1 | * | 12/2001 | Vartuli et al. ............... 310/363 |
| 6,346,762 B2 | * | 2/2002 | Watanabe et al. ........... 310/328 |
| 6,545,391 B1 | * | 4/2003 | Su et al. ...................... 310/332 |

FOREIGN PATENT DOCUMENTS

| | | | | |
|---|---|---|---|---|
| JP | 60-178677 | * | 9/1985 | .................. 310/311 |
| JP | 2-246385 | * | 10/1990 | .................. 310/365 |
| JP | 4-67418 | * | 3/1992 | .................. 360/27 |
| JP | 4-161077 | * | 6/1992 | .................. 310/332 |

* cited by examiner

*Primary Examiner*—Thomas M. Dougherty
(74) *Attorney, Agent, or Firm*—Black Lowe & Graham PLLC

(57) ABSTRACT

A bimorph actuator is driven by electrostrictive materials configured to change length in response to applied electrical field. A first electrostrictive material is positioned between a first electrode and a second electrode. A second electrostrictive material is positioned between a second electrode and a third electrode. The second electrostrictive material and the first electrostrictive material are attached to each other such that a differential change in their respective lengths results in a lateral motion. A first voltage source provides a voltage differential between the first electrode and the third electrode. A second variable voltage applied to the second electrode causes the length of the first electrostrictive material to lengthen when the second electrostrictive material shortens, and vice versa. A system of electrodes for the bimorph actuator and a method for actuating electrostrictive materials are also provided.

9 Claims, 5 Drawing Sheets

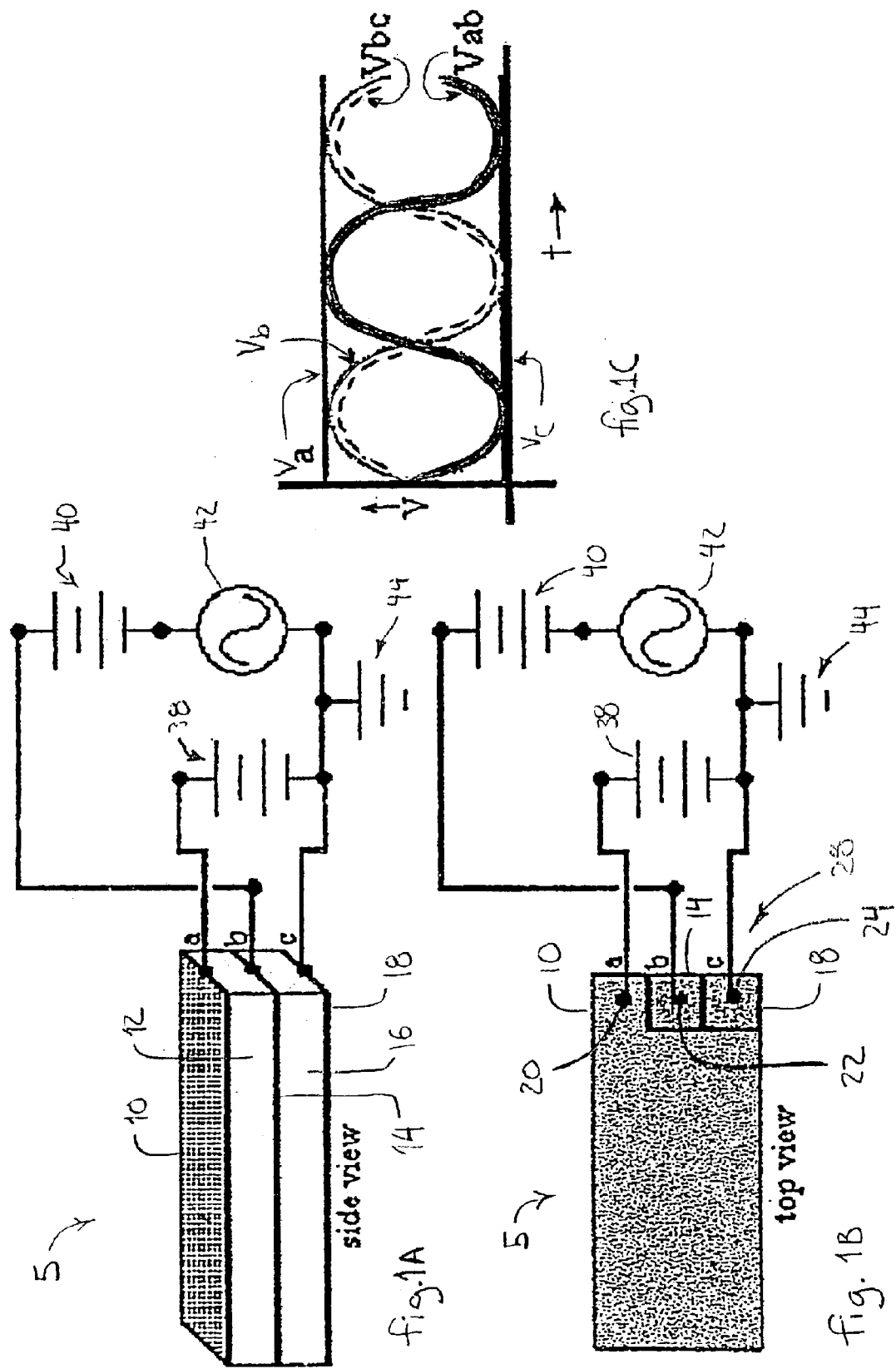

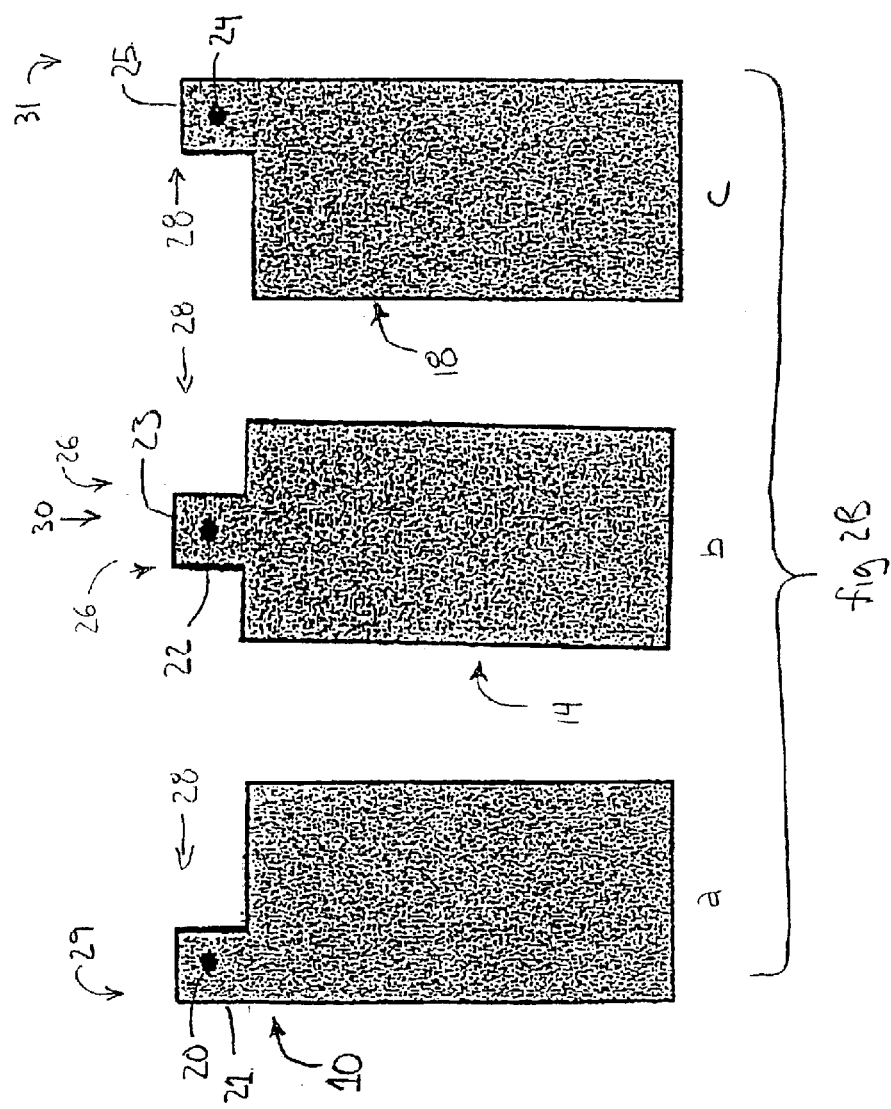
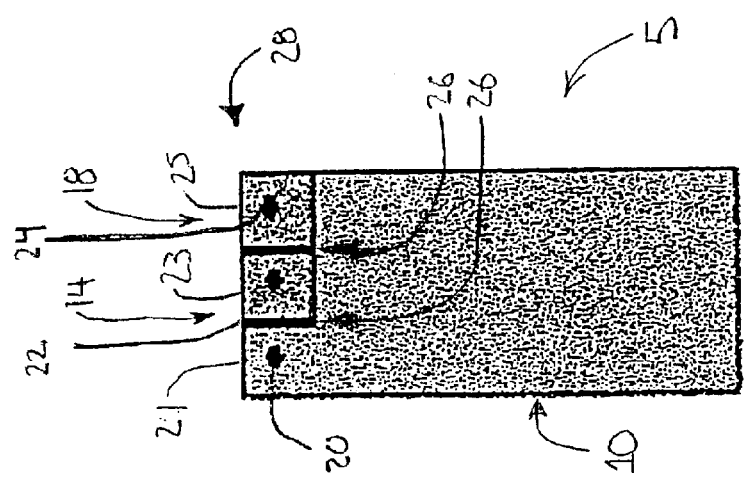

ELECTRICAL SYSTEM FOR ELECTROSTRICTIVE BIMORPH ACTUATOR

GOVERNMENT LICENSE RIGHTS

This invention was made with Government support under U.S. Government contract awarded by the Department of the Army, DADD-19-99-C-0023. The Government has certain rights in this invention.

FIELD OF THE INVENTION

This invention relates generally to electrostrictive materials and, more specifically, to actuators based upon electrostrictive materials.

BACKGROUND OF THE INVENTION

Piezoelectric materials exhibit strain when subject to an applied electrical field. For example, piezoelectric materials exhibit both elongation and contraction when subject to varying electric fields. As a result, piezoelectric materials have been used in actuator applications where their linear relationship of strain to the applied field is exploited to create both elongation and contraction, thereby creating a bi-directional actuator.

Recent advances in the fields of piezoelectric and ferroelectric research has lead to the discovery of new materials exhibiting even larger but electrostrictive or contractive strain. In particular, electrostrictive crystals such as Lead Magnesium Niobate-Lead Titanate [PMN-PT] and Lead Zinc Niobate-Lead Titanate [PZN-PT] and electron-irradiated copolymer poly (vinylidene fluoride-trifluoroethyline) [P(VDF-TrFE)] exhibit large energy densities and recoverable strains of 1 to 4%. In general, the higher strain capacity and energy density of electrostrictive materials (as compared to piezoelectric materials) make them attractive replacements for piezoelectrics in actuators. For example, the strain coefficient for the piezoelectric polyvinylidene fluoridine is less than 10% of the strain coefficient for the electrostrictive irradiated P(VDF-TrFE).

However, electrostrictive materials only exhibit unidirectional strain even when polarity of the applied electrical field is reversed. Due to this feature, only unimorph or one-directional electrostrictive actuators have been created. Unimorph electrostrictive actuators typically include a passive restoring layer. This reduces the active portion of the actuator, and thus decreases the total energy density of the actuator. If the entire actuator could be active, an electrostrictive bimorph or bi-directional actuator could theoretically exceed the performance of a similar piezoelectric bimorph actuator by a factor of at least 5. However, a fully active bimorph electrostrictive actuator would have to compensate for the material having only unidirectional strain.

Therefore, there is an unmet need for bimorph or bi-directional actuators using electrostrictive materials.

SUMMARY OF THE INVENTION

The present invention provides a bimorph actuation of systems utilizing high-density electrostrictive materials thereby permitting the size and weight of electrically driven actuators to be reduced.

The present invention presents a system for a bimorph actuator driven by electrostrictive materials. An embodiment of the system includes a first electrode, a second electrode, a first electrostrictive material configured to change length in response to an applied electrical field positioned between the first electrode and the second electrode, a third electrode, and a second electrostrictive material configured to change length in response to an applied electrical field positioned between the second electrode and the third electrode. The second electrostrictive material and the first electrostrictive material are attached to each other such that a differential change in their respective lengths results in a lateral motion. A first voltage source is arranged to provide a voltage differential between the first electrode and the third electrode causing lengths of the first electrostrictive material and the second electrostrictive material to decrease. A second voltage source is arranged to provide a variable voltage to the second electrode. The variable voltage causes the length of the first electrostrictive material to increase when the length of the second electrostrictive material decreases, and conversely causes the length of the first electrostrictive material to decrease when the length of second electrostrictive material increases.

According to other aspects, the present invention also provides a system of electrodes for the bimorph actuator and a method for actuating electrostrictive materials. The present invention may also be utilized to generate electrical power for sampling or other purposes.

BRIEF DESCRIPTION OF THE DRAWINGS

The preferred and alternative embodiments of the present invention are described in detail below with reference to the following drawings.

FIG. 1A is a side-view of the bimorph actuator connected to an exemplary drive circuit;

FIG. 1B is a top view of the bimorph actuator connected to an exemplary drive circuit;

FIG. 1C is a plot of voltage versus time for the bimorph actuator;

FIG. 2A is a top view of the first electrode, second, and third electrodes in assembled configuration;

FIG. 2B are top views of the individual first, second and third electrodes;

DETAILED DESCRIPTION OF THE INVENTION

Figure 3:
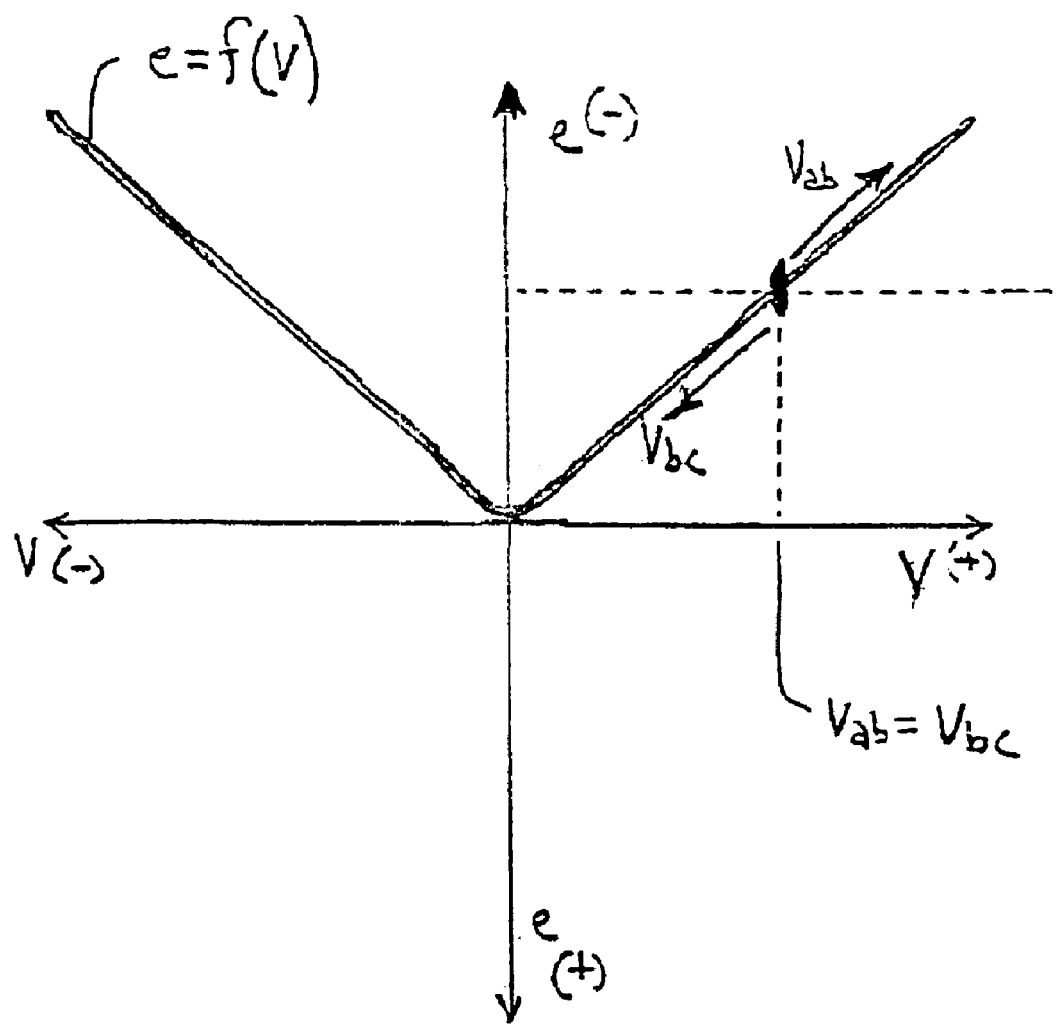
FIG. 3 is a plot of voltage versus strain showing strain derived from the applied voltages.

By way of overview, the present invention provides a system for a bimorph actuator driven by electrostrictive materials. The system includes a first electrode, a second electrode, a first electrostrictive material configured to change length in response to an applied electrical field positioned between the first electrode and the second electrode, a third electrode, and a second electrostrictive material configured to change length in response to an applied electrical field positioned between the second electrode and the third electrode. The second electrostrictive material and the first electrostrictive material are attached to each other such that a differential change to their respective lengths results in a lateral motion. A first voltage source is arranged to provide a voltage differential between the first electrode and the third electrode thereby causing lengths of the first electrostrictive material and the second electrostrictive material to decrease. A second voltage source is arranged to provide a variable voltage to the second electrode. The variable voltage causes the length of the first electrostrictive material to increase when the length of the second electrostrictive material decreases, and conversely causes the length of the first electrostrictive material to decrease when the length of second electrostrictive material increases. Another embodiment of the present invention provides a system of electrodes for the bimorph actuator and a method for actuating electrostrictive materials. The present invention may be utilized to generate electrical power for sampling or other purposes.

As a result, the present invention advantageously provides bimorph actuation of systems utilizing high-density electrostrictive materials, thereby permitting the size and weight of electrically driven actuators and sensors to be reduced.

FIG. 1A is a side view of a system 5 of an exemplary bimorph actuator of the present invention. An electrode 14 is sandwiched between a layer 12 of electrostrictive material and a layer 16 of electrostrictive material. A second electrode 10 is arranged against the layer 12, sandwiching the layer 12 between the electrode 14 and electrode 10. A third electrode 18 is arranged against the layer 16 to sandwich the electrostrictive layer 16 between the electrode 14 and electrode 18. Layer 12 and the layer 16 are suitably electrostrictive materials that contract when subjected to an electrical field.

Suitable electrostrictive materials include electrostrictive crystals such as Lead Magnesium Niobate-Lead Titanate [PMT-PT], Lead Zinc Niobate-Lead Titanate [PZN-PT], and electron irradiated copolymer poly(vinylidene fluoride-trifuoroethyline) [P(VDF-TrFE)]. Other electrostrictive materials include grafted elastomers, ceramic electrostrictives, other relaxor ferroelectric-ferroelectric solid-state solutions, ionic polymers, and PVDF terpolymers. In one presently preferred embodiment, the layer 12 and the layer 16 are sheets of irradiated P(VDF-TrFE). Relaxor ferroelectric-ferroelectric solid-state solutions are a family of electrostrictive crystals including PZN-PT and PMT-PT as well as other complex perovskite crystal analogs. It will be appreciated that the electrostrictive materials act as dielectrics, and do not conduct appreciable current.

The electrodes, electrode 10, 14, and 18 may be any suitable electrical conductor including without limitation gold, copper, or aluminum. The electrodes 10, 14, and 18 may be sheet conductors, or may be conductors that are sputtered or chemical-vapor-deposited on the electrostrictive material. In one presently preferred embodiment, the electrodes 10, 14, and 18 each include sheets of electrically conductive material, such as copper or the like.

The electrode 10, layer 12, electrode 14, layer 16, and electrode 18 may be assembled by any suitable method that links the layer 12 to the layer 16 such that differential changes in length between the layer 12 and the layer 16 cause the bimorph actuator system 5 to move laterally by bending. In an exemplary embodiment, the electrode 10 is fastened to the layer 12, the layer 12 is fastened to the electrode 14, the electrode 14 is fastened to the layer 16, and the layer 16 is fastened to the electrode 18 suitably using thin-film adhesive. Any suitable method of fastening may be utilized, including without limitation thin film adhesive, double stick films, RBC epoxy, or applied adhesive. In one embodiment, an acceptable adhesive includes Spurr Epoxy manufactured by Poly Sciences, Inc. In another exemplary embodiment, the thin film adhesive is a double-stick acrylic film with adhesive on both sides. Any suitable attachment, including mechanical attachments or fasteners, such as non-conducting rivets or pins, may be suitably used to connect the layer 12 to the layer 16 so that differential changes in the respective lengths of the layer 12 and the layer 16 cause the system 5 to move laterally by bending. For example, if one end of the system 5 is restrained, bending causes lateral motion of the unrestrained end. If both ends of the system 5 are restrained from moving laterally, the middle section will move laterally as the system 5 bends. This lateral motion or the bending suitably may be used to drive mechanical systems.

The electrode 10 and the electrode 16 are connected to a voltage source 38. The voltage source 38 generates an electric field between the electrode 10 and the electrode 18. In an exemplary embodiment, the voltage source 38 is a DC voltage source that induces a constant electrical field through the layer 12 and the layer 16, suitably shortening the layer 12 and the layer 16.

The electrode 14 is also connected to a voltage source, such as a bias voltage source 40 and an AC voltage source 42. The bias-source 40 and the AC source 42 cooperate to apply a varying voltage to electrode 14. Changing the voltage applied to the electrode 14 results in a different electrical field being applied to the layer 12 than is applied to the layer 16. As the electrostrictive materials in the layer 12 and the layer 16 respond differently to different electrical fields, the lengths of the layer 12 and the layer 16 differ, and the system 5 bends. The voltage applied to the electrode 14 suitably may be a variable voltage if controlled bending of the system 5 is desired. If periodic motion of the system 5 is desired, the voltage applied to the electrode 14 suitably may be a biased AC source such as that generated by the bias source 40 and the AC source 42 shown in FIG. 1A.

The electrode 18, one terminal of the voltage source 38 and one terminal of the bias source 40 and AC source 42 are suitably connected to a ground terminal 44.

FIG. 1B shows a top view of the bimorph actuator system 5 illustrating a suitable method of connecting the electrode 10, electrode 14, and electrode 18 to their respective power supplies. In this embodiment, the electrode 10 and electrode 18 are connected to two terminals of the voltage source 38, respectively. The electrode 14 is connected to one terminal of the bias source 40. The other output terminal of the bias source 40 is connected to a terminal of the AC source 42. Another terminal of the AC source 42 is connected to the electrode 18. The electrode 18 is also connected to a terminal ground 44.

FIG. 1B illustrates the power connections to the electrode 10, electrode 14, and electrode 18. The connection may include any suitable electrical connection including riveting, soldering, plug and socket, and screw terminal connections. In this exemplary embodiment, a connection 20 to the electrode 10, a connection 22 to the electrode 14, and a connection 24 to the electrode 18 suitably do not overlap. Instead, they are aligned on a connection end 28 of the bimorph actuator system 5, with the connection 22 to the electrode 14 intermediate the connection 20 for electrode 10 and the connection 24 for the electrode 18. It will be understood that any suitable circuitry and suitable arrangement of connections and connection types that permit applying an electrical base field to the electrode 10 and the electrode 18, and providing a variable voltage to the electrode 14 will suitably activate the bimorph actuator system 5.

FIG. 1C is a plot of voltage V over time showing the different voltages applied by the voltage source 38 and the bias source 40 and AC source 42 to the electrodes of the bimorph actuator system 5 as shown in FIGS. 1A and 1B. The voltage source 38 applies a DC voltage differential to the electrode 10 and electrode 18 such that voltage $V_a$ at the electrode 10 is greater than voltage $V_c$ at the electrode 18. In this example, $V_a$ and $V_c$ are constant over time. Voltage $V_b$ applied to the electrode 14 varies over time. In this example, the voltage $V_b$ is a biased AC voltage varying periodically between $V_a$ and $V_c$. When $V_b$ equals $V_a$ plus $V_c$ divided by 2, voltage $V_{ab}$ across the layer 12 equals voltage $V_{bc}$ applied across the layer 16. As the voltage $V_b$ rises, the voltage $V_{ab}$ falls, while the voltage $V_{bc}$ rises. Conversely, as $V_b$ drops, the voltage $V_b$, drops, while the voltage $V_{ab}$ increases.

In FIG. 1C, $V_b$ is a periodic biased AC voltage and thus $V_{ab}$ is a sine wave function. $V_{bc}$ is the inverse of the $V_{ab}$ curve, inverted around the average voltage $V_a$ plus $V_c$ divided by two. It can be seen from FIG. 1C that as the voltage differential and hence the electric field across one of the electrostrictive layers is increasing, the voltage and hence the electric field across the other layer is decreasing, and vice-versa.

FIG. 2A shows an exemplary embodiment of electrodes of the bimorph actuator system 5. The electrode 10 is suitably a sheet electrode and is shown in assembled top view covering the electrode 14 and the electrode 18. The electrostrictive layers 12 and 16 are not shown. All of the connections to the electrodes are at an end 28 of the bimorph system 5. Each electrode has a tab with a connection. The electrode 10 has a tab 21 with a connection 20. The electrode 14 has a tab 23 with a connection 22. The electrode 18 has a tab 25 with a connection 24. The tabs and connections are all aligned along the end 28 of the bimorph system 5. The tab 23 is located intermediate tab 21 and tab 25, and the lateral edges 26 of the tab 23 are adjacent to tab 21 and the tab 25. As noted, any suitable alignment of electrode connections, tab shapes, and tab connection methods may be utilized to provide appropriate voltages to the electrodes 10, 14, and 18.

FIG. 2B shows an exemplary configuration for the electrodes 10, 14, and 18, and their tabs and connections. The electrode 10, electrode 14, and electrode 18 are shown separately, that is, unassembled. The electrode 10, electrode 14, and electrode 18 all have their tabs and connections on the same end 28. In this embodiment, the tab 21 is situated near a left edge 29 of the connection end 28 of the electrode 10. The tab 23 is arranged near the center 30 of the connection end 28 of electrode 14. The tab 25 is arranged near a right edge 31 of the connection end 28 of the electrode 18. It will be appreciated that with the tab 23 arranged near the center 30 of the connection edge 28, the electrode 10 and the electrode 18 are substantially mirror images of each other. It will also be appreciated that the shapes of the electrode 10 and the electrode 18 may be switched. In that instance, the resulting bimorph actuator system is substantially a mirror image of the bimorph actuator system 5 shown in FIG. 2A. In this exemplary embodiment, it will be appreciated that as mirror images the electrodes 10 and 18 may advantageously be manufactured as identical pieces. The electrode 18 is the same as the electrode 10 but simply flipped over. When the electrode 10, electrode 14, and electrode 18 are stacked with intervening layers of electrostrictive material, the resulting assemblage is shown in FIG. 1A. The electrode tabs and the electrode connections are aligned on the connection end 28 of the bimorph actuator system 5 and the connections do not overlap. This facilitates electrical connection to the bimorph actuator system 5 because the electrical connection 20, connection 22, and connection 24 do not overlap or touch. The electrical connectors 20, 22 and 23 are suitably near each other to facilitate providing power to the electrical connections.

FIG. 3 is a plot of strain $\in$ versus voltage V showing the operation of the present invention. Strain $\in$ is proportional to $V^2$. The accepted equation is $\in = QE^2$, where Q is the electrostrictive coefficient with E being applied voltage. At higher voltages, electrostrictive materials can approximate linear responses to voltage changes. As shown in FIG. 3, electrostrictive materials have a negative strain $\in$ in response to both positive and negative voltages. Strain $\in$ as a function of voltage is thus negative for electrostrictive materials. Contraction or negative strain $\in$ increases with increasing positive voltage or increasing negative voltage. In the example shown in FIG. 3, when the voltage $V_{ab}$ across the first electrostrictive layer 12 is equal to the voltage $V_{bc}$ across the second electrostrictive layer 16, the layer 12 and the layer 16 have equal generated strain if they originally have equal length and are made of the same material or respond equally to the applied voltage. Thus, when applied voltage $V_{ab}$ equals $V_{bc}$, the layer 12 and the layer 16 still have the same length.

In the actuator system shown in FIG. 1A and FIG. 1B an additional biased AC voltage is applied to the electrode 14. This applies an increasing voltage across the layer 12 when a decreasing voltage is applied across the layer 16. When this occurs, strain on the layer 12 increases, and strain on the layer 16 decreases. Because the strain is negative, the layer 12 shortens and the layer 16 lengthens from their respective identical lengths when $V_{ab}$ equals $V_{bc}$. The length of the layer 12 becomes less than that of the layer 16 and the assemblage bends. Conversely, as $V_{ab}$ decreases with the result that $V_{bc}$, increases, with strain being negative with increasing voltage, the layer 16 shortens while the layer 12 lengthens. The assemblage then bends in the opposite direction. By way of example, electric fields suitably applied to sheets of irradiated P(VDF-TrFE) are approximately 1 to 200 million volts per meter. If a periodic motion of the actuator is desired, the frequency of the AC voltage applied may range from nearly DC to up to 10 kilohertz. There is no known lower limit to how slowly this configuration can actuate.

Figure 4:
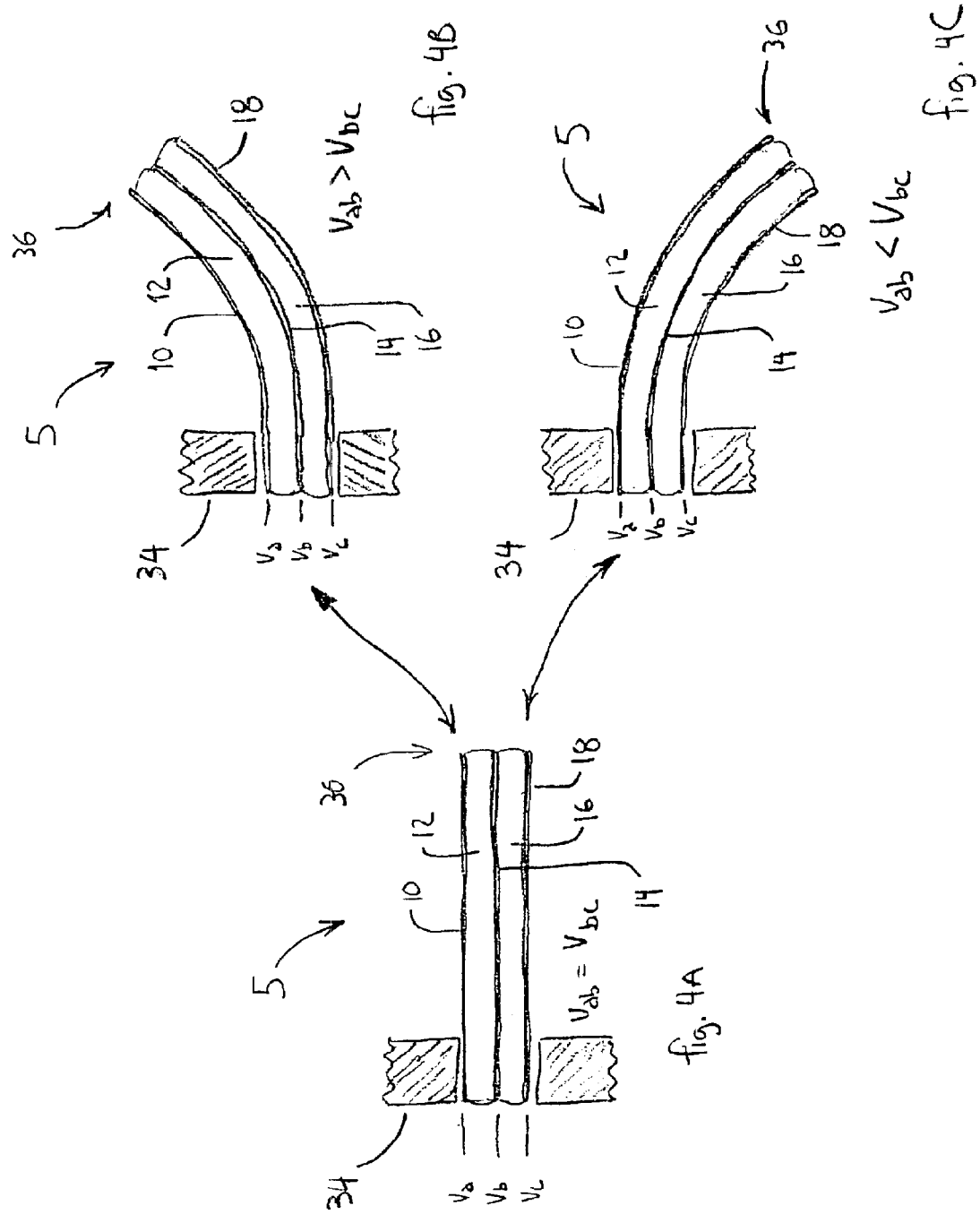
FIG. 4A is a side view of the present invention.
FIG. 4B is a side view showing bending of the present invention.
FIG. 4C is a side view showing opposite bending of the present invention.

FIGS. 4A, 4B, and 4C show the actuator system 5 in operation. If one end of the bimorph actuator system 5 is held in a holder 34, the other unrestricted end 36 deflects as varying voltages are applied to the electrostrictive materials. In FIG. 4A, the voltage $V_{ab}$ across layer 12 is equal to the voltage $V_{bc}$ across the layer 16. Because the voltage $V_{ab}$ is equal to the voltage $V_{bc}$, both layers 12 and 16 have the same length, and the system 5 is straight. In the embodiment shown in FIG. 4A, the electrodes 10, 14, and 18 are thin, sheet metal electrodes. The electrostrictive material layers 12 and 16 are thin sheets of irradiated P(VDF-TrFE) that have equal length before any electrical field is applied. In this embodiment, the electrode 10 is attached to the layer 12, the layer 12 is attached to the electrode 14, the electrode 14 is attached to the layer 16, and the layer 16 is attached to the electrode 18 with double-stick adhesive sheets (not shown).

FIG. 4B shows deflection of the bimorph actuator 5 when the voltage applied to the electrode 14 is decreased. This increases the voltage difference $V_{ab}$ between the electrode 10 and the electrode 14 and decreases the voltage difference $V_{bc}$ between the electrode 14 and the electrode 18 with the result that $V_{ab}$ is greater than $V_{bc}$ ($V_{ab} > V_{bc}$). In this instance, the layer 12 contracts relative to its length shown in FIG. 4A, and the layer 16 expands relative to its length shown in FIG. 4A, with the result that the bimorph actuator 5 bends in a direction towards the electrode 10.

FIG. 4C shows the converse of FIG. 4B. In this instance $V_b$ is increased, with the result that the voltage difference $V_{ab}$ between the electrode 10 and the electrode 14 decreases, while the voltage difference $V_{bc}$ between the electrode 14 and the electrode 18 increases. Again, because these are electrostrictive materials where contraction increases with increasing voltage and contraction decreases with decreasing voltage, the layer 12 lengthens and the layer 16 shortens as compared to their length as shown in FIG. 4A when $V_{ab}$ equals $V_{bc}$. In this instance, the actuator bends in a direction toward the electrode 18.

It will be appreciated that the bimorph actuator system 5 may be used to drive any number of mechanical and electromechanical systems. Examples of systems that can be driven by a bimorph electrostrictive actuator include ultrasonic speakers, making and breaking electrical contacts, optical switching, and mechanical systems such as windshield wipers.

In an ultrasonic system, or in a speaker, an electrostrictive actuator suitably may drive a diaphragm, thereby generating electro-ultrasonic pulses or sound. In an electrical system, the electrostrictive actuator suitably may make or break contacts, thereby acting as a relay. In an optical system, an electrostrictive actuator suitably may move a mirror or other optical switch, thereby switching optical transmissions. In mechanical systems, the bimorph electrostrictive actuator may activate any suitable mechanical device. Using electrostrictive materials in a bimorph actuator system permits the actuator to have a higher energy density, or, in other words, lighter weight for the same power than comparable piezoelectric actuators.

Figure 5:
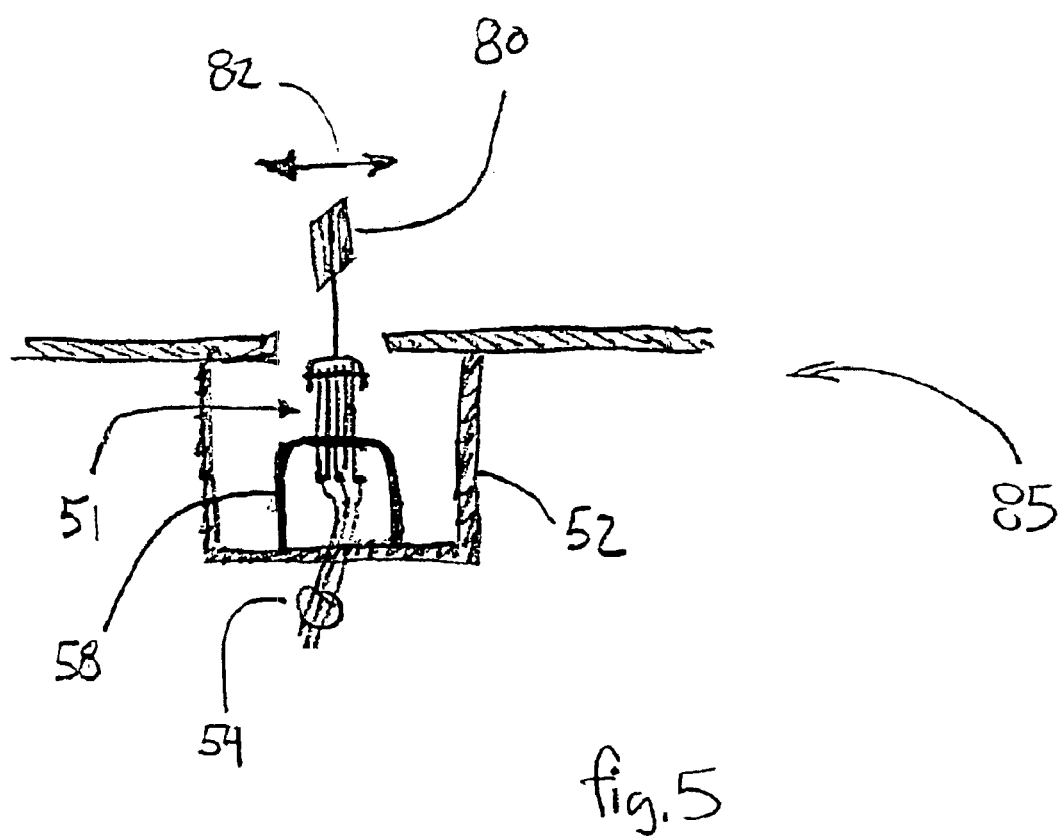
FIG. 5 is a cross section of an energy sampler driven by the present invention.

A bimorph actuator suitably may also be used to sample movement or generate power from movement. As is known, electrostrictive materials exhibit strain when subjected to varying voltages. However, electrostrictive materials operate in a reverse direction as well, generating voltage differences when strain is applied. If a vibrating sampler is attached to a bimorph actuator, the actuator will generate a voltage differential, and that voltage differential is higher than that produced by a piezoelectric actuator under the same strain. Thus, a bimorph actuator may be used to sample vibrations or motion, or even to generate power from vibrations or motion. By way of example, and not by limitation, FIG. 5 shows an airflow sensor 85. A suitable paddle 80 is connected to a bimorph actuator 51. The paddle 80 is placed in an airflow 82 that causes deflection or vibration in the actuator 51. The actuator 51 is supported by an actuator support 58 attached to a frame 52, so the paddle 80 suitably projects into the airflow 82. Deflection or vibration of the paddle 80 causes the bimorph actuator to deflect or vibrate, thereby generating a voltage differential. The voltage differential can be sampled through a power cable 54 connected to the actuator 51. The sensor system 85 can sense deflection and vibration which can be measured by voltage derived from the bimorph actuator 51 through the power cable 54.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

What is claimed is:

1. A system for a bimorph actuator, the system comprising:
    a first electrode;
    a second electrode;
    a first electrostrictive material having a first length and configured to change length in response to an applied electrical field, the first electrostrictive material being positioned between the first electrode and the second electrode;
    a third electrode;
    a second electrostrictive material having a second length and configured to change length in response to an applied electrical field, the second electrostrictive material being positioned between the second electrode and the third electrode, the second electrostrictive material and the first electrostrictive material being attached to each other such that a differential change in the first length and the second length results in a lateral motion of the first electrostrictive material and the second electrostrictive material;
    a first voltage source arranged to provide a voltage differential between the first electrode and the third electrode, one of the first and third electrode being a ground, the voltage differential causing lengths of the first electrostrictive material and the second electrostrictive material to simultaneously change from the first length and the second length to a third length and a fourth length, respectively, that are shorter than the first length and the second length, respectively; and
    a second voltage source arranged to provide a biased variable voltage to the second electrode, the variable voltage causing length of the first electrostrictive material to change from the third length towards a fifth length that is shorter than the third length when the length of second electrostrictive material changes from the fourth length towards the second length, the variable voltage further causing the length of the first electrostrictive material to change from the third length toward the first length when the length of the second electrostrictive material changes from the fourth length towards a sixth length that is shorter than the fourth length.

2. The system of claim 1, wherein the second voltage source includes a biased AC voltage source, such that the lateral motion is periodic.

3. The system of claim 1, wherein the first electrode includes a first connection tab, the second electrode includes a second electrode tab, and the third electrode includes a third connection tab, the first, second, and third connection tabs being arranged to not overlap each other.

4. The system of claim 3, wherein the second connection tab is located intermediate the first connection tab and the third connection tab.

5. The system of claim 1, wherein the first electrostrictive material and the second electrostrictive material include one of grafted elastomers, ionic polymers, ceramics, relaxor ferroelectric-ferroelectric solid-state solutions, lead zinc niobate-lead titanate, and electron irradiated copolymer polyvinylidene fluoride-trifluoroethyline.

6. The system of claim 5, wherein the relaxor ferroelectric-ferroelectric solid-state solutions include one of lead magnesium, PZN-PT electrostrictive crystals, PMN-PT electrostrictive crystals, and complex perovskite crystal analogs.

7. The system of claim 1, wherein the first electrostrictive material and the second electrostrictive material are attached to each other with an attachment including adhesive.

8. The system of claim 1, wherein the adhesive includes at least one sheet of adhesive film.

9. A method for actuating electrostrictive materials, the method comprising:

providing a first electrode;

providing a second electrode;

providing a first electrostrictive material having a first length and configured to change length in response to an applied electrical field, the first electrostrictive material being positioned between the first electrode and the second electrode;

providing a third electrode;

providing a second electrostrictive material having a second length and configured to change length in response to an applied electrical field, the second electrostrictive material being positioned between the second electrode and the third electrode;

attaching the second electrostrictive material and the first electrostrictive material to each other such that a differential change in the first length and the second length results in a lateral motion;

applying a first voltage arranged to provide a voltage differential between the first electrode and the third electrode, one of the first electrode and the third electrode being a ground, the voltage differential causing lengths of the first electrostrictive material and the second electrostrictive material to change from the first length and the second length to a third length and a fourth length, respectively, that are shorter than the first length and the second length, respectively; and applying a second voltage, arranged to provide a biased variable voltage to the second electrode, the variable voltage causing length of the first electrostrictive material to change from the third length towards a fifth length that is shorter than the third length when the length of second electrostrictive material changes from the fourth length towards the second length, the variable voltage further causing the length of the first electrostrictive material to change from the third length toward the first length when the length of the second electrostrictive material changes from the fourth length towards a sixth length that is shorter than the fourth length, the changing of the lengths of the first and second electrostrictive materials occurring simultaneously.

* * * * *